United States Patent
Nakabayashi et al.

(10) Patent No.: US 12,419,012 B2
(45) Date of Patent: Sep. 16, 2025

(54) POWER CONVERSION APPARATUS

(71) Applicant: TOSHIBA MITSUBISHI-ELECTRIC INDUSTRIAL SYSTEMS CORPORATION, Chuo-ku (JP)

(72) Inventors: Shigeyuki Nakabayashi, Chuo-ku (JP); Shotaro Murakami, Chuo-ku (JP); Ikuto Udagawa, Chuo-ku (JP)

(73) Assignee: TMEIC CORPORATION, Chuo-ku (JP)

( * ) Notice: Subject to any disclaimer, the term of this patent is extended or adjusted under 35 U.S.C. 154(b) by 206 days.

(21) Appl. No.: 17/640,998

(22) PCT Filed: Oct. 9, 2019

(86) PCT No.: PCT/JP2019/039820
§ 371 (c)(1),
(2) Date: Mar. 7, 2022

(87) PCT Pub. No.: WO2021/070283
PCT Pub. Date: Apr. 15, 2021

(65) Prior Publication Data
US 2022/0346272 A1    Oct. 27, 2022

(51) Int. Cl.
*H05K 7/20*    (2006.01)
*H02M 7/00*    (2006.01)

(52) U.S. Cl.
CPC ........ *H05K 7/20272* (2013.01); *H02M 7/003* (2013.01)

(58) Field of Classification Search
CPC .......... H01L 23/473; H01L 2924/0002; H05K 7/20272; H05K 7/20927; H02M 7/003; G06F 1/20
See application file for complete search history.

(56) References Cited

U.S. PATENT DOCUMENTS 4,513,346 A * 4/1985 Devins ................. H01L 25/117
361/212
5,043,797 A * 8/1991 Lopes ................... H01L 25/117
257/E23.098
(Continued)

FOREIGN PATENT DOCUMENTS

JP    06154876 A  *  3/1986
JP    08028773 A  *  2/1996
(Continued)

OTHER PUBLICATIONS

Tominaga Isamu; 'Water-Cooled-Type Thyristor Valve', Dec. 10, 1999, Toshiba Corp, Description (Espacenet Machine Translation of JP H11340395 A) (Year: 1999).*
(Continued)

*Primary Examiner* — Jayprakash N Gandhi
*Assistant Examiner* — Jeffrey Francis Stoll
(74) *Attorney, Agent, or Firm* — Oblon, McClelland, Maier &Neustadt, L.L.P.

(57) ABSTRACT

A power conversion apparatus includes: a first stage on which a first module is mounted, a second stage stacked on the first stage and on which a second module is mounted, and a coolant circulation circuit allowing a coolant to circulate through the first and second modules. The coolant circulation circuit includes a first cooling pipe disposed on the first stage, a second cooling pipe disposed on the second stage, a first connecting member provided at an opening end of the first cooling pipe, a second connecting member provided at an opening end of the second cooling pipe, a connecting pipe connecting the first connecting member and the second connecting member, a first coupler that couples a first end portion of the connecting pipe to the first connecting member, and a second coupler that couples a second end portion of the connecting pipe to the second connecting member.

8 Claims, 9 Drawing Sheets

(56) References Cited

U.S. PATENT DOCUMENTS 5,144,531 A * 9/1992 Go .................. H01L 23/473
                                                257/E23.098
2016/0242318 A1* 8/2016 Krug, Jr. ............ H05K 7/20254

FOREIGN PATENT DOCUMENTS

JP          11340395 A   * 12/1999
JP         2019-22309 A     2/2019

OTHER PUBLICATIONS

Takao Yasushi; 'Coupler for Piping', Feb. 2, 1996, Fujitsu Ltd, Description (Espacenet Machine Translation of JP H0828773 A) (Year: 1996).*
Matsumoto, Hisaaki et al; 'Water-Cooled Thyristor Valve', Mar. 19, 1986, Toshiba Corp, Description (Espacenet Machine Translation of JP S6154876 A) (Year: 1986).*
International Search Report issued Dec. 10, 2019 in PCT/JP2019/039820, filed on Oct. 9, 2019, 2 pages.

* cited by examiner

POWER CONVERSION APPARATUS

TECHNICAL FIELD

The present disclosure relates to a power conversion apparatus.

BACKGROUND ART

Japanese Patent Laying-Open No. 2019-22309 (PTL 1) discloses a power conversion apparatus having a water-cooled thyristor valve. The thyristor valve described in PTL 1 has a plurality of thyristors connected in series. PTL 1 discloses a configuration in which a cooling pipe connected in common to a plurality of thyristors is disposed as a cooling water piping system for the thyristor valve, and cooling water is circulated between a plurality of thyristors and a cooling device through the cooling pipe.

CITATION LIST

Patent Literature

PTL 1: Japanese Patent Laying-Open No. 2019-22309

SUMMARY OF INVENTION

Technical Problem

A thyristor valve is typically configured such that stages provided with a plurality of thyristor modules are piled up in the top-bottom direction. In the operation of installing or replacing the thyristor valve, the cooling pipe has to be disposed in a state in which a plurality of stages are stacked, and a complicated and time-taking operation is required.

In the present disclosure, a power conversion apparatus capable of achieving efficient operation in installation and replacement is provided.

Solution to Problem

According to the present disclosure, a power conversion apparatus includes a first stage on which a first module is mounted, a second stage stacked on the first stage and on which a second module is mounted, and a coolant circulation circuit that allows a coolant to circulate through the first and second modules. The coolant circulation circuit includes a first cooling pipe disposed on the first stage to allow the coolant to pass through the first module, a second cooling pipe disposed on the second stage to allow the coolant to pass through the second module, a first connecting member provided at an opening end of the first cooling pipe, a second connecting member provided at an opening end of the second cooling pipe, a connecting pipe that connects the first connecting member and the second connecting member, a first coupler that couples a first end portion of the connecting pipe to the first connecting member, and a second coupler that couples a second end portion of the connecting pipe to the second connecting member.

Advantageous Effects of Invention

The power conversion apparatus in the present disclosure can achieve the efficient operation in installation and replacement.

DESCRIPTION OF EMBODIMENTS

Figure 1:
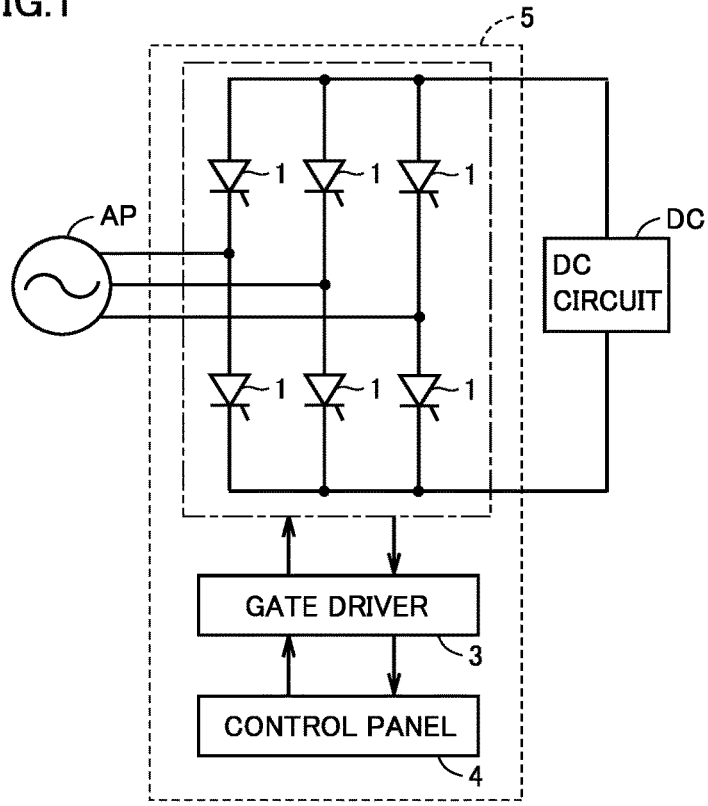
FIG. 1 is a main circuit configuration diagram of a power conversion apparatus according to an embodiment of the present invention.

Embodiments of the present invention will be described in detail below with reference to the drawings. In the following, the same or corresponding parts in the drawings are denoted by the same reference signs and a description thereof will basically not be repeated.

FIG. 1 is a main circuit configuration diagram of a power conversion apparatus according to an embodiment of the present invention. A power conversion apparatus 5 according to the present embodiment is configured to perform power conversion between alternating-current (AC) power and direct-current (DC) power. In the example in FIG. 1, power conversion apparatus 5 is a three-phase bridge rectifier and configured to convert three-phase AC power supplied from a three-phase AC power supply AP into DC power and output the DC power to a DC circuit DC.

Referring to FIG. 1, power conversion apparatus 5 according to the present embodiment includes a plurality of thyristor valves 1, a gate driver 3, and a control panel 4.

Thyristor valve 1 is a kind of a rectifier for power conversion and has a configuration including a plurality of switching elements in combination. High-voltage and large-capacity thyristors are used as the switching elements.

Gate driver 3 generates a gate pulse for driving a plurality of thyristors included in thyristor valve 1. Control panel 4 exchanges a variety of signals with gate driver 3 to control power conversion by thyristor valve 1.

Figure 2:
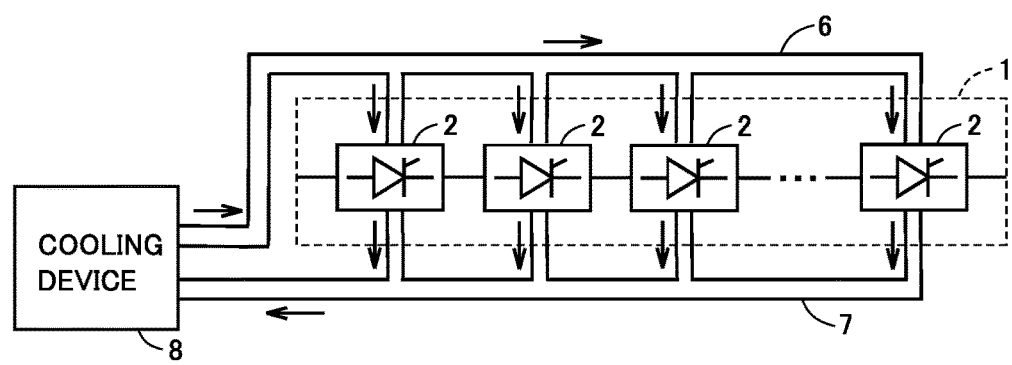
FIG. 2 is a diagram showing a configuration example of a thyristor valve shown in FIG. 1.
Figure 3:
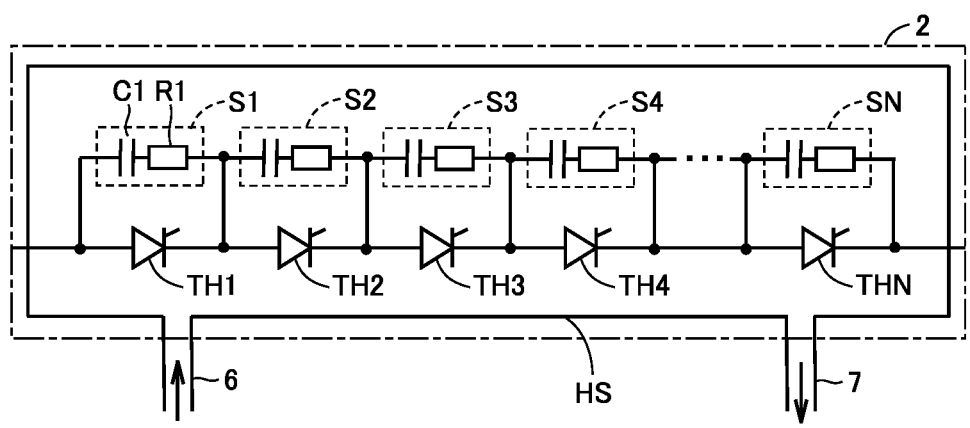
FIG. 3 is a diagram showing a configuration example of a thyristor module shown in FIG. 2.

FIG. 2 is a diagram showing a configuration example of thyristor valve 1 shown in FIG. 1. Referring to FIG. 2, thyristor valve 1 is configured such that a plurality of thyristor modules 2 are connected in series. FIG. 3 is a diagram showing a configuration example of thyristor module 2 shown in FIG. 2.

Referring to FIG. 3, thyristor module 2 has a plurality of thyristors TH1 to THN connected in series and a plurality of snubber circuits S1 to SN respectively connected in parallel with a plurality of thyristors TH1 to THN. Hereinafter, a plurality of thyristors TH1 to THN may be collectively referred to as thyristors TH, and a plurality of snubber circuits S1 to SN may be collectively referred to as snubber circuits S.

A light-triggered thyristor driven by an optical signal (gate pulse) can be used for each of a plurality of thyristors TH1 to THN. Firing (on)/extinguishing (off) of each thyristor TH is controlled in response to a gate pulse applied from gate driver 3. A plurality of thyristors TH1 to THN are driven to convert three-phase AC power into DC power.

Each of a plurality of snubber circuits S1 to SN has a series circuit of a capacitor C1 and a resistor R1. A plurality of snubber circuits S evenly divide an AC voltage component applied between two terminals of thyristor module 2 and control a spike-like high voltage produced at the time of turn-on and turn-off of the corresponding thyristors TH to prevent damage to thyristors TH.

Gate driver 3 generates a gate pulse, for example, based on a variety of signals applied from control panel 4 and a state of voltage applied to a plurality of thyristors TH. Gate driver 3 outputs the generated gate pulse to each thyristor TH at a predetermined timing to control the driving of each thyristor TH. Gate driver 3 can also detect, for example, a failure of each thyristor TH, based on the state of voltage applied to each thyristor TH.

Control panel 4 performs a process of determining a phase (timing) to drive a plurality of thyristors TH1 to THN. Control panel 4 transmits a signal indicating the determined phase to gate driver 3.

Thyristor module 2 further includes a heatsink HS. Heatsink HS has a coolant channel through which a coolant flows for cooling heat-generating elements such as thyristors TH and snubber circuits S. To heatsink HS, an inlet tube 6 for introducing the coolant to the coolant channel and an outlet tube 7 for discharging the coolant from the coolant channel are connected. For example, air, cooling water (pure water), and hydrofluorocarbons are used as the coolant. In the present embodiment, cooling water is used.

As shown in FIG. 2, inlet tube 6 and outlet tube 7 are provided in common to a plurality of thyristor modules 2 that constitute thyristor valve 1. The upstream end of inlet tube 6 and the downstream end of outlet tube 7 are connected to a cooling device 8. The coolant (cooling water) circulates between cooling device 8 and a plurality of thyristor modules 2 through inlet tube 6 and outlet tube 7.

Specifically, cooling device 8 includes a heat exchanger and feeds the cooling water cooled by heat exchange to inlet tube 6. The arrows in FIG. 2 show the passage direction of the cooling water. The cooling water fed to inlet tube 6 is introduced into heatsink HS of each thyristor module 2. The cooling water flows through the coolant channel formed in heatsink HS to cool thyristors TH and snubber circuits SN of each thyristor module 2. After cooling each thyristor module 2, the cooling water is sent from the coolant channel to outlet tube 7. The cooling water is returned to cooling device 8 via outlet tube 7 and cooled by heat exchange, and thereafter returned to inlet tube 6 again. Although not shown, inlet tube 6 or outlet tube 7 is provided with a pump for circulating the cooling water through a coolant circulation circuit including cooling device 8, inlet tube 6, heatsink HS, and outlet tube 7.

Figure 4:
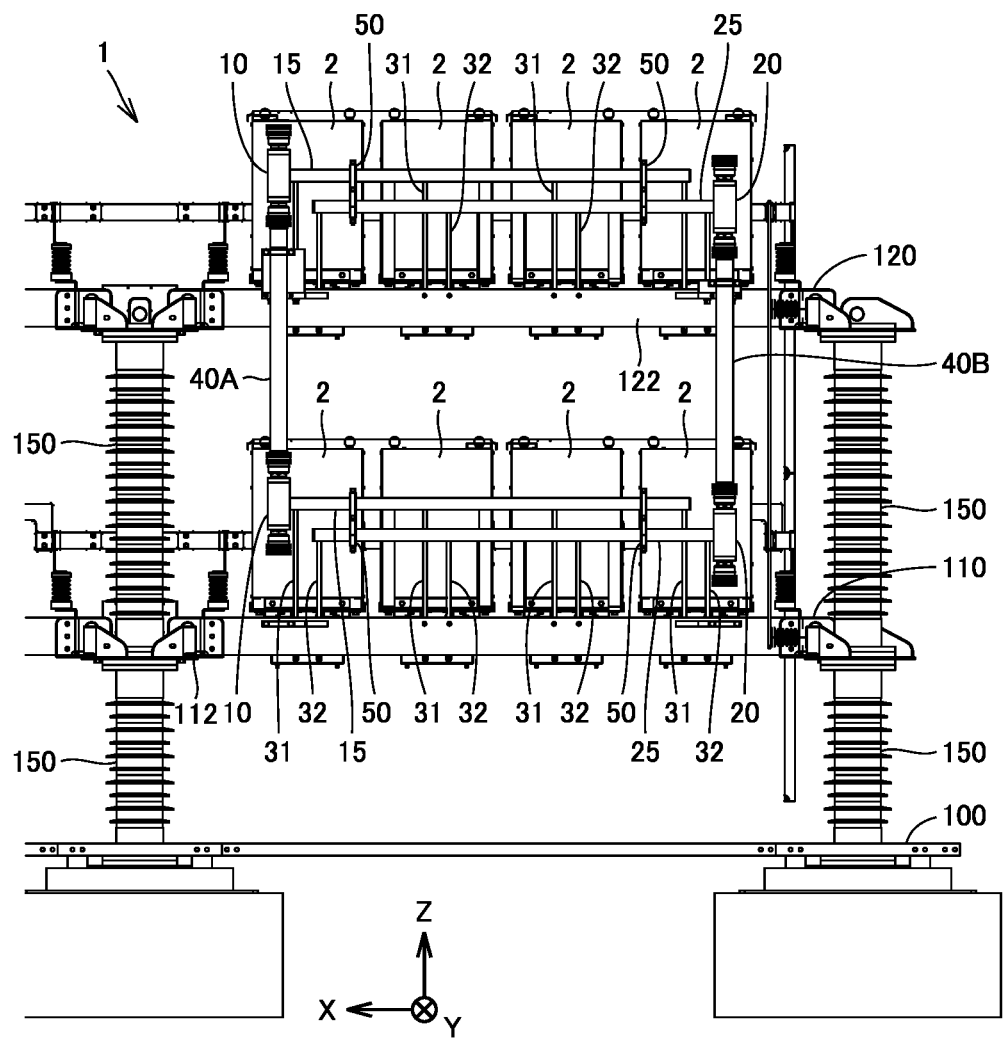
FIG. 4 is a front view of the thyristor valve.
Figure 5:
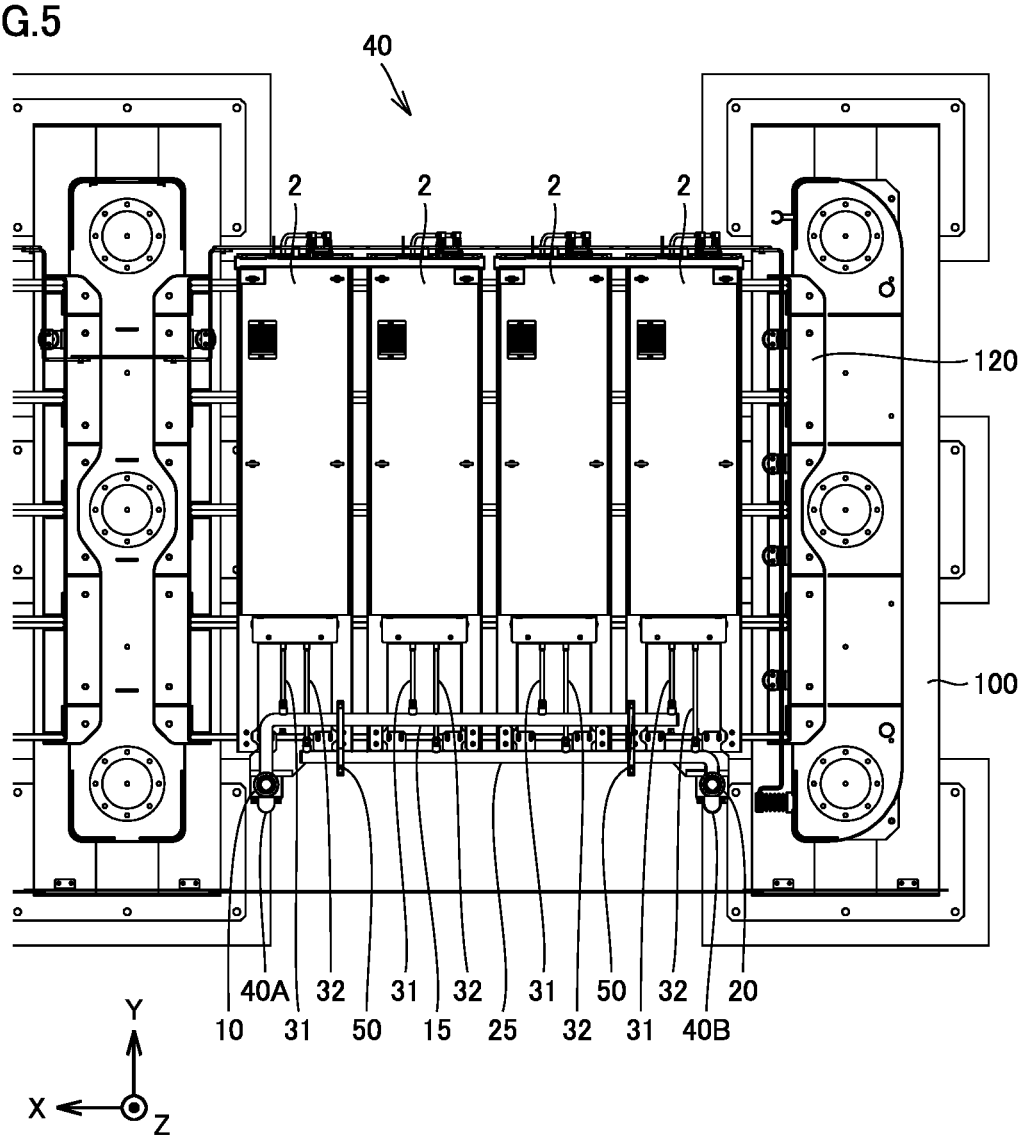
FIG. 5 is a top view of the thyristor valve.

A configuration example of thyristor valve 1 shown in FIG. 2 will now be described. FIG. 4 is a front view of thyristor valve 1. FIG. 5 is a top view of thyristor valve 1. In the following description, the right-left direction (or lateral direction) is X direction, the front-back direction is Y direction, and the top-bottom direction (or longitudinal direction) is Z direction.

Thyristor valve 1 according to the present embodiment is configured such that stages provided with a plurality of thyristor modules 2 are piled up in the top-bottom direction (Z direction). In FIG. 4, among a plurality of stages, a first stage 110 and a second stage 120 stacked on an insulating frame 100 serving as a base are representatively shown.

First stage 110 has an insulating frame 112 and a plurality of (for example, four) thyristor modules 2 arranged side by side in the X direction on insulating frame 112. Insulating frame 112 is insulated from insulating frame 100 by insulating struts 150.

Second stage 120 includes an insulating frame 122 and a plurality of (for example, four) thyristor modules 2 arranged side by side in the X direction on insulating frame 122. Insulating frame 122 is insulated from insulating frame 112 by insulating struts 150.

As illustrated in FIG. 2, four thyristor modules 2 mounted on first stage 110 and four thyristor modules 2 mounted on second stage 120 are electrically connected in series.

Thyristor valve 1 includes cooling pipes 15, 25, 31, and 32, connecting members 10 and 20, and connecting pipes 40A and 40B, as a cooling circuit for a plurality of thyristor modules 2.

Cooling pipes 31 and 32 are connected to each thyristor module 2. Specifically, cooling pipe 31 has one end connected to heatsink HS (see FIG. 2) of thyristor module 2 and the other end connected to cooling pipe 15. Cooling pipe 32 had one end connected to heatsink HS of thyristor module 2 and the other end connected to cooling pipe 25. Cooling pipe 31 forms a part of inlet tube 6 (see FIG. 2) for introducing cooling water into the coolant channel in heatsink HS. Cooling pipe 32 forms a part of outlet tube 7 (see FIG. 2) for discharging cooling water from the coolant channel in heatsink HS.

In first stage 110, four cooling pipes 31 corresponding to four thyristor modules 2 are connected in common to cooling pipe 15. Cooling pipe 15 extends in the lateral direction (X direction). Cooling pipe 15 is closed at one end and has an opening at the other end. The opening is provided with connecting member 10.

Further, in first stage 110, four cooling pipes 32 corresponding to four thyristor modules 2 are connected in common to cooling pipe 25. Cooling pipe 25 extends in the lateral direction (X direction). Cooling pipe 25 is closed at one end and has an opening at the other end. The opening is provided with connecting member 20. Cooling pipe 15 and cooling pipe 25 are supported by at least one support member 50 on insulating frame 112. Cooling pipes 15 and 25 on first stage 110 correspond to an example of "first cooling pipe".

In second stage 120, similar to first stage 110, four cooling pipes 31 corresponding to four thyristor modules 2 are connected in common to cooling pipe 15. Four cooling pipes 32 corresponding to four thyristor modules 2 are connected in common to cooling pipe 25. The opening at the other end of cooling pipe 15 is provided with connecting member 10. The opening at the other end of cooling pipe 25 is provided with connecting member 20. Cooling pipe 15 and cooling pipe 25 are supported by at least one support member 50 on insulating frame 122. Cooling pipes 15 and 25 on second stage 120 correspond to an example of "second cooling pipe".

Connecting member 10 is a member for connecting cooling pipes 15 to each other between adjacent stages. However, in first stage 110, connecting member 10 is used for connecting cooling pipe 15 to cooling pipe 15 on second stage 120 and connecting it to a connecting pipe (not shown) to cooling device 8.

Connecting member 20 is a member for connecting cooling pipes 25 to each other between adjacent stages. However, in first stage 110, connecting member 20 is used for connecting cooling pipe 25 to cooling pipe 25 on second stage 120 and connecting it to a connecting pipe (not shown) to cooling device 8. Connecting members 10 and 20 on first stage 110 correspond to an example of "first connecting member", and connecting members 10 and 20 on second stage 120 correspond to an example of "second connecting member".

Connecting pipe 40A is connected between connecting member 10 on first stage 110 and connecting member 10 on second stage 120. As shown in FIG. 4, connecting pipe 40A has a first end portion in the Z direction connected to connecting member 10 on first stage 110 and has a second end portion connected to connecting member 10 on second stage 120.

Connecting pipe 40B is connected between connecting member 20 on first stage 110 and connecting member 20 on second stage 120. As shown in FIG. 4, connecting pipe 40B has a first end portion in the Z direction connected to connecting member 20 on first stage 110 and has a second end portion connected to connecting member 20 on second stage 120.

In the configuration described above, cooling pipes 15 and 31 and connecting member 10 on first stage 110, connecting pipe 40A, and cooling pipes 15 and 31 and connecting member 10 on second stage 120 constitute a part of inlet tube 6 shown in FIG. 2. Cooling pipes 25 and 32 and connecting member 20 on first stage 110, connecting pipe 40B, and cooling pipes 25 and 32 and connecting member 20 on second stage 120 constitute a part of outlet tube 7 shown in FIG. 2.

Figure 6:
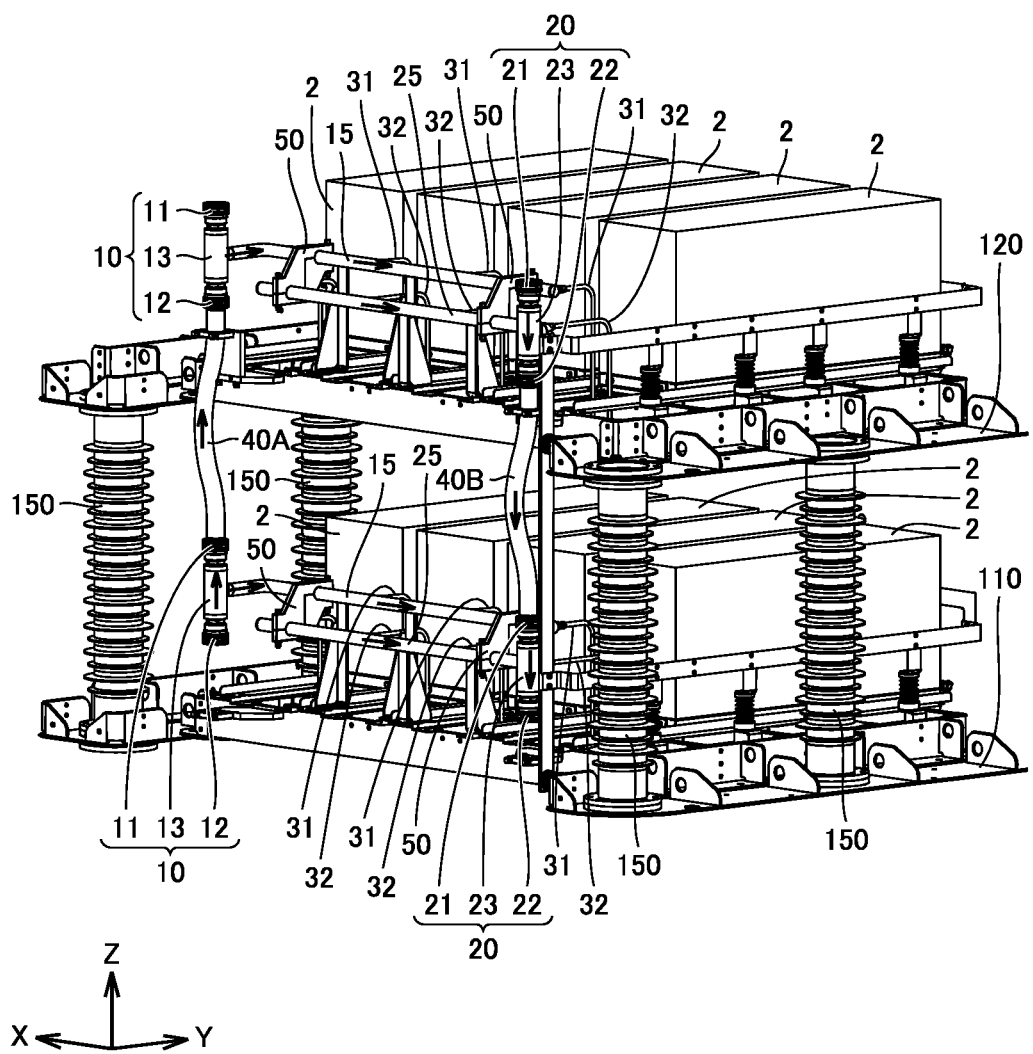
FIG. 6 is a diagram illustrating a flow of cooling water in a cooling circuit.

FIG. 6 is a diagram illustrating a flow of cooling water in the cooling circuit. FIG. 6 shows a perspective view of thyristor valve 1. The arrows in the figure show the direction of the flow of the cooling water.

Referring to FIG. 6, connecting member 10 has a tubular portion 13 extending in the top-bottom direction (Z direction) and connecting portions 11 and 12 provided at both ends of tubular portion 13. In first stage 110, connecting member 10 has connecting portion 11 connected to the first end portion of connecting pipe 40A and has connecting portion 12 connected to an end portion of the connecting pipe (not shown) to cooling device 8. In second stage 120, connecting member 10 has connecting portion 11 connected to a first end portion of a connecting pipe (not shown) on a third stage and has connecting portion 12 connected to the second end portion of connecting pipe 40A.

Connecting member 20 has a tubular portion 23 extending in the top-bottom direction (Z direction) and connecting portions 21 and 22 provided at both ends of tubular portion 23. In first stage 110, connecting member 20 has connecting portion 21 connected to the first end portion of connecting pipe 40B and has connecting portion 22 connected to an end portion of the connecting pipe (not shown) to cooling device 8. In second stage 120, connecting member 20 has connecting portion 21 connected to a first end portion of a connecting pipe (not shown) on the third stage and has connecting portion 22 connected to the second end portion of connecting pipe 40B.

In first stage 110, connecting member 10 receives the cooling water cooled by cooling device 8 through the not-shown connecting pipe. The cooling water is introduced from connecting member 10 into cooling pipe 15 on first stage 110 and introduced into connecting pipe 40A. The cooling water introduced into cooling pipe 15 on first stage 110 is introduced into heatsink HS of each thyristor module 2 via cooling pipe 31. Four thyristor modules 2 on first stage 110 are thus cooled. The cooling water after cooling is introduced from heatsink HS of each thyristor module 2 into cooling pipe 25 via cooling pipe 32. The cooling water discharged to cooling pipe 25 is fed to the not-shown connecting pipe via connecting member 20.

On the other hand, the cooling water introduced from connecting member 10 into connecting pipe 40A is guided to connecting member 10 on second stage 120. In second stage 120, the cooling water is introduced into cooling pipe 15 via connecting member 10. The cooling water introduced into cooling pipe 15 on second stage 120 is introduced into heatsink HS of each thyristor module 2 via cooling pipe 31. Four thyristor modules 2 on second stage 120 are thus cooled. The cooling water after cooling is introduced from heatsink HS of each thyristor module 2 into cooling pipe 25 via cooling pipe 32. The cooling water discharged to cooling pipe 25 is fed to connecting pipe 40B via connecting member 20. The cooling water fed to connecting pipe 40B is merged with the cooling water from first stage 110 at connecting member 20 on first stage 110 and thereafter fed to the not-shown connecting pipe. The cooling water after cooling is thus returned to cooling device 8 and cooled.

In this way, in thyristor valve 1 configured such that a plurality of stages are stacked like a tower, cooling pipes 15 and 25 disposed for individual stages are connected to each other through connecting members 10 and 20 and connecting pipes 40A and 40B to form a coolant circulation circuit (see FIG. 2) between a plurality of thyristor modules 2 included in thyristor valve 1 and cooling device 8.

On the other hand, in a situation in which the above-noted thyristor valve 1 is newly installed or replaced, it is necessary to perform the step of piling up stages and the step of disposing connecting pipes 40A and 40B between the piled stages.

Figure 7:
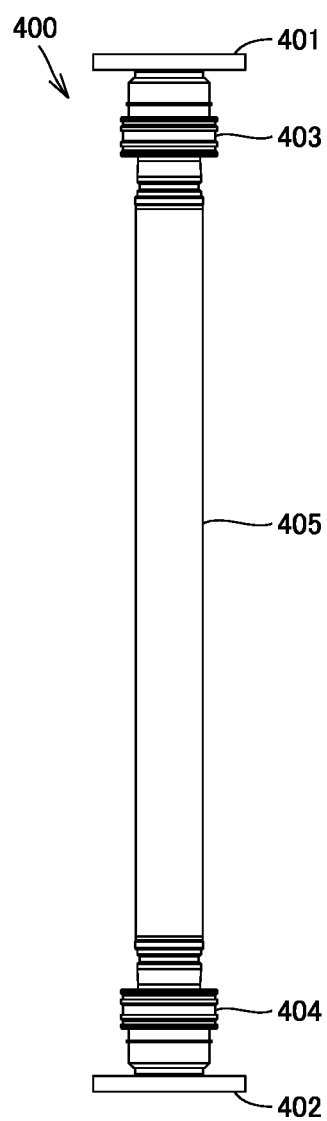
FIG. 7 is a diagram showing a configuration of a connecting pipe according to a comparative example.

Here, it is assumed that a connecting pipe 400 according to a comparative example shown in FIG. 7 is applied to each of connecting pipes 40A and 40B. Referring to FIG. 7, connecting pipe 400 according to the comparative example has an insulating pipe 405 extending linearly, joints 403 and 404, and flanges 401 and 402. Joint 403 is connected to one end portion of insulating pipe 405, and joint 404 is connected to the other end of insulating pipe 405. Flange 401 is connected to joint 403, and flange 402 is connected to joint 404.

When connecting pipe 40A is disposed between the piled stages, flange 401 of connecting pipe 400 according to the comparative example is joined to a flange provided at connecting portion 12 of connecting member 10 on second stage 120 with an annular gasket interposed, and the two flanges facing each other with the gasket interposed are fastened by a bolt and a nut. Similarly, flange 402 of connecting pipe 400 is joined to a flange provided at connecting portion 11 of connecting member 10 on first stage 110 with an annular gasket interposed, and the two flanges facing each other with the gasket interposed are by a bolt and a nut.

Further, when connecting pipe 40B is disposed between the piled stages, flange 401 of connecting pipe 400 is joined to a flange provided at connecting portion 22 of connecting member 20 on second stage 120 with an annular gasket interposed, and the two flanges facing each other with the gasket interposed are fastened by a bolt and a nut. Similarly, flange 402 of connecting pipe 400 is joined to a flange provided at connecting portion 21 of connecting member 20 on first stage 110 with an annular gasket interposed, and the two flanges facing each other with the gasket interposed are fastened by a bolt and a nut.

In this way, when connecting pipes 400 according to the comparative example are applied to connecting pipes 40A and 40B, connecting pipes 40A and 40B are disposed between adjacent stages by fastening flanges 401 and 401 at both ends of each connecting pipe 400 to the flanges provided at connecting portions 11 and 12 by bolts after performing the step of piling up stages. Accordingly, as the number of stages included in thyristor valve 1 increases, the number of operation steps for disposing connecting pipes 40A and 40B increases, leading to increase in assembly cost of thyristor valve 1.

Figure 8:
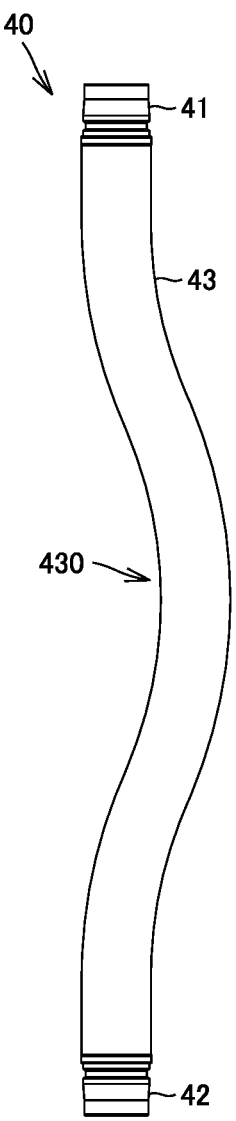
FIG. 8 is a diagram showing a configuration example of a connecting pipe according to the present embodiment.

Then, in the present embodiment, connecting pipes 40 shown in FIG. 8 are applied to connecting pipes 40A and 40B. Connecting pipe 40 shown in FIG. 8 is configured such that a coupler is used for connection to connecting members 10 and 20. Preferably, connecting pipe 40 can use a one-touch coupler (quick coupler) for connection to connecting members 10 and 20.

Specifically, referring to FIG. 8, connecting pipe 40 according to the present embodiment has an insulating pipe 43 and plugs 41 and 42. Insulating pipe 43 is formed of, for example, polyethylene, polypropylene, polystyrene, polyvinyl chloride, polyester, and Teflon (registered trademark). Insulating pipe 43 has a curved portion 430.

Plug 41 is formed at a first end portion of insulating pipe 43, and plug 42 is formed at a second end portion of insulating pipe 43. Plugs 41 and 42 are formed of, for example, stainless steel. On the outer peripheral surfaces of plugs 41 and 42, O rings serving as annular seal members are provided to seal the inner peripheral surfaces of connecting portions 11, 12, 21 and 22 of connecting members 10 and 20.

Figure 9:
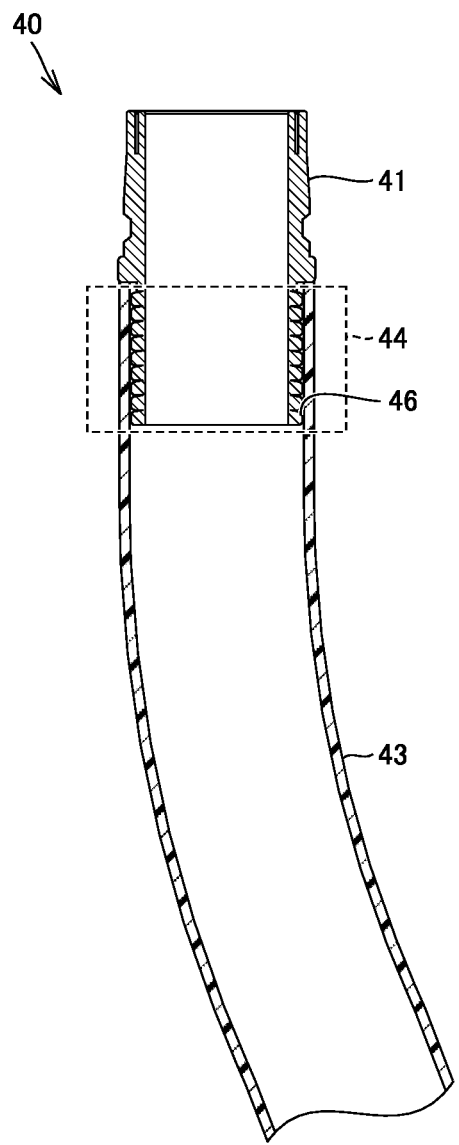
FIG. 9 is a cross-sectional view of the connecting pipe shown in FIG. 8.

FIG. 9 is a cross-sectional view of connecting pipe 40 shown in FIG. 8. FIG. 9 shows a cross-section of plug 41 and a part of insulating pipe 43.

As shown in FIG. 9, insulating pipe 43 covers an outer peripheral surface 46 of plug 41 at a coupling portion 44 between plug 41 and insulating pipe 43. An electric field therefore may concentrate between the inner peripheral surface of insulating pipe 43 and the outer peripheral surface of plug 41 at an end portion of plug 41. In the present embodiment, in order to suppress electric field concentration, outer peripheral surface 46 of plug 41 has a curved surface shape protruding outward.

Figure 10:
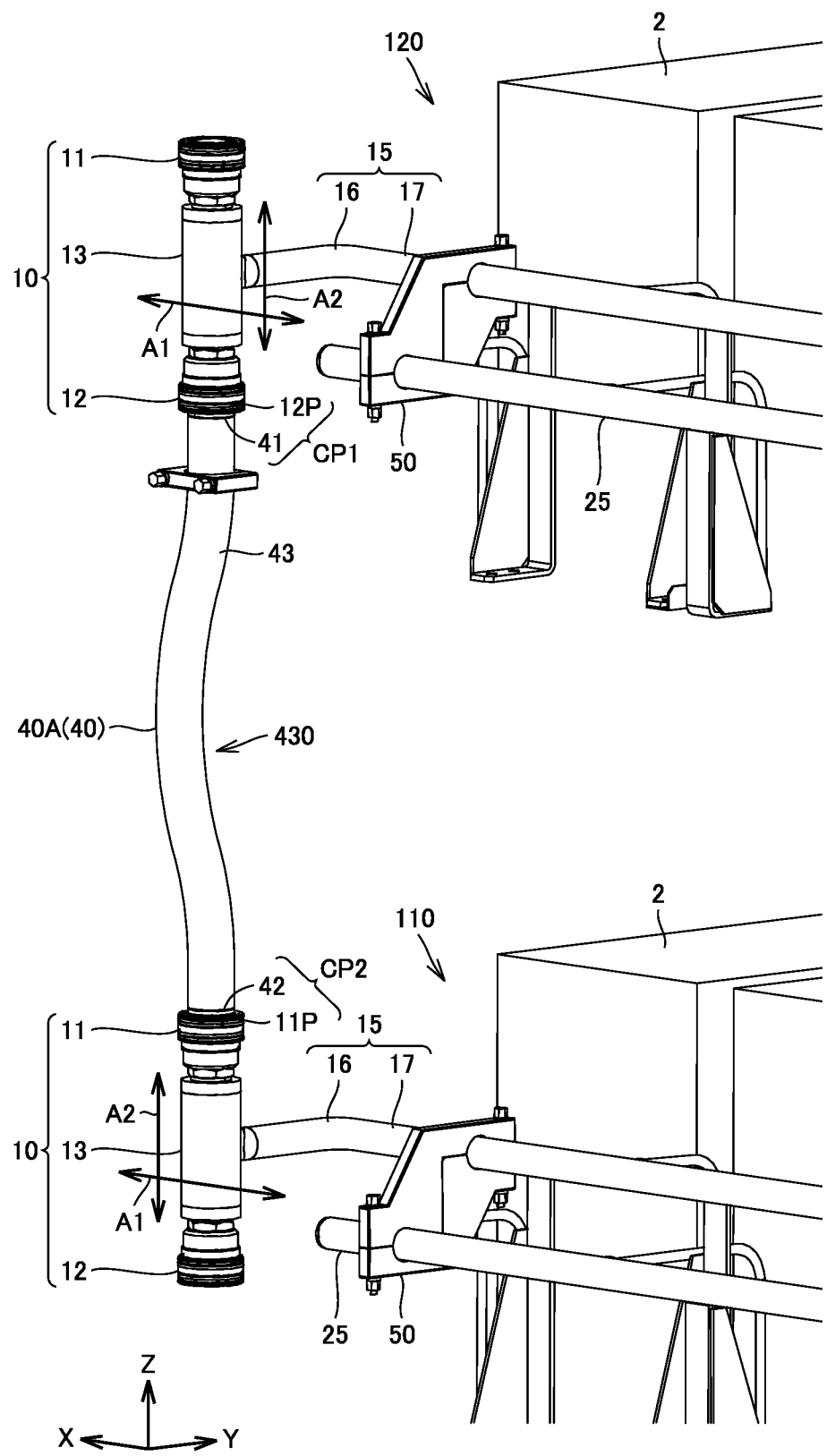
FIG. 10 is a perspective view specifically showing cooling pipes, connecting members, and the connecting pipe of the thyristor valve.

FIG. 10 is a perspective view specifically showing cooling pipes 15, connecting members 10, and connecting pipe 40A of thyristor valve 1.

Referring to FIG. 10, connecting portions 11 and 12 of connecting member 10 are provided with sockets 11P and 12P, respectively. Sockets 11P and 12P are configured to be coupled to plugs 41 and 42 of connecting pipe 40. Socket 12P and plug 41 constitute a coupler CP1. Socket 11P and plug 42 constitute a coupler CP2. Coupler CP2 corresponds to an example of "first coupler", and coupler CP1 corresponds to an example of "second coupler".

When connecting pipe 40A is disposed between first stage 110 and second stage 120, plug 41 of connecting pipe 40 is coupled to socket 12P of connecting member 10 on second stage 120, and plug 42 of connecting pipe 40 is coupled to socket 11P of connecting member 10 on first stage 110. Although not shown, when connecting pipe 40B is disposed between first stage 110 and second stage 120, plug 41 of connecting pipe 40 is connected to socket 21P provided at connecting portion 21 of connecting member 20 on second stage 120, and plug 42 of connecting pipe 40 is coupled to socket 22P provided at connecting portion 22 of connecting member 20 on first stage 110.

For example, when the step of piling up second stage 120 on first stage 110, plug 41 of connecting pipe 40 is coupled to each of socket 12P of connecting member 10 and socket 22P of connecting member 20 on second stage 120, as a preparation operation for piling up second stage 120. Subsequently, second stage 120 having connecting pipes 40 connected is piled up on first stage 110. Subsequently, in a state in which second stage 120 is piled up, plug 42 of connecting pipe 40 is coupled to each of socket 11P of connecting member 10 and socket 21P of connecting member 20 on first stage 110.

In particular, when one-touch couplers are applied to couplers CP1 and CP2, the operator can easily dispose connecting pipes 40A and 40B. As a result, it is possible to perform the step of disposing connecting pipes 40A and 40B concurrently with the step of piling up a stage. This can suppress increase in the number of operation steps due to increase in stages that constitute thyristor valve 1.

Here, as illustrated in FIG. 8, in connecting pipe 40 according to the present embodiment, insulating pipe 43 has curved portion 430. With this configuration, the creepage distance between adjacent stages can be increased in a state in which connecting pipes 40A and 40B are disposed.

In addition, provision of curved portion 430 in insulating pipe 43 imparts flection to insulating pipe 43. In the example in FIG. 10, when plug 41 of connecting pipe 40 is coupled to socket 12P of connecting member 10, plug 41 has to be inserted in the horizontal direction (corresponding to the Z direction) into socket 12P in order to seal between the inner peripheral surface of socket 12P and the outer peripheral surface of plug 41. Similarly, when plug 42 of connecting pipe 40 is coupled to socket 11P of connecting member 10, plug 42 has to be inserted in the horizontal direction (corresponding to the Z direction) into socket 11P.

In the present embodiment, because insulating pipe 43 is flexible, even when misregistration based on an assembly error occurs between socket 11P of connecting member 10 on first stage 110 and socket 12P of connecting member 10 on second stage 120, the worker can insert plugs 41 and 42 into sockets 11P and 12P, respectively, by deforming insulating pipe 43.

Further, in the present embodiment, in order to permit misregistration of sockets 11P and 12P between adjacent stages in connecting member 10 on each stage, cooling pipe 15 has a bending portion 16. Specifically, cooling pipe 15 has a linear portion 17 extending in the Y direction and bending portion 16 bent relative to linear portion 17. Bending portion 16 is positioned between the opening end of cooling pipe 15 and a support portion in contact with support member 50. In the example in FIG. 10, bending portion 16 is bent in a direction (X direction) intersecting the direction in which linear portion 17 extends (Y direction).

With such a configuration, connecting member 10 can be displaced relative to linear portion 17 through bending portion 16. For example, as indicated by arrow A1 in FIG. 10, connecting member 10 can be displaced in the horizontal direction (X direction). As indicated by arrow A2 in FIG. 10, connecting member 10 can be displaced in the vertical direction (Z direction). The amount of displacement of connecting member 10 in each direction depends on the rigidity of cooling pipe 15, the radius of curvature of bending portion 16, and the distance from connecting member 10 to bending portion 16.

With this configuration, the operator can adjust the position and the inclination of sockets 11P and 12P when coupling plugs 41 and 42 of connecting pipe 40 to sockets 11P and 12P of connecting members 10, respectively. Therefore, even when misregistration based on an assembly error occurs between socket 11P of connecting member 10 on first stage 110 and socket 12P of connecting member 10 on second stage 120, plugs 41 and 42 of connecting pipe 40 can be inserted in the horizontal direction into sockets 11P and 12P. As a result, connecting pipe 40 and connecting member 10 are reliably coupled without increasing the number of operation steps.

Although not shown, cooling pipe 25 also has a bending portion, similarly to cooling pipe 15. Connecting pipe 40 and connecting member 20 thus can be reliably coupled.

The embodiments disclosed here should be understood as being illustrative in all respects and should not be construed as being limitative. The scope of the present invention is shown not in the foregoing description but in the claims, and it is intended that all modifications that come within the meaning and range of equivalence to the claims are embraced here.

REFERENCE SIGNS LIST 1 thyristor valve, 2 thyristor module, 3 gate driver, 4 control panel, 5 power conversion apparatus, 6 inlet tube, 7 outlet tube, 8 cooling device, 10, 20 connecting member, 11, 12, 21, 22 connecting portion, 11P, 12P socket, 13, 23 tubular portion, 16 bending portion, 17 linear portion, 40, 40A, 40B, 400 connecting pipe, 41, 42 plug, 43, 405 insulating pipe, 44 coupling portion, 46 outer peripheral surface, 50 support member, 100, 112, 122 insulating frame, 110 first stage, 120 second stage, 401, 402 flange, 403, 404 joint, 430 curved portion, CP1, CP2 coupler, HS heatsink, S1 to SN snubber circuit, TH1 to THN thyristor.

The invention claimed is:

1. A power conversion apparatus comprising:
a first stage on which a first module is mounted;
a second stage stacked on the first stage and on which a second module is mounted; and
a coolant circulation circuit that allows a coolant to circulate through the first and second modules,
the coolant circulation circuit including
a first cooling pipe disposed on the first stage, the first cooling pipe allowing the coolant to pass through the first module,
a second cooling pipe disposed on the second stage, the second cooling pipe allowing the coolant to pass through the second module,
a first connecting member provided at an opening end of the first cooling pipe,
a second connecting member provided at an opening end of the second cooling pipe,
a connecting pipe that connects the first connecting member and the second connecting member,
a first coupler that couples a first end portion of the connecting pipe to the first connecting member, and
a second coupler that couples a second end portion of the connecting pipe to the second connecting member,
wherein the connecting pipe has an insulating pipe disposed between the first end portion and the second end portion,
wherein the insulating pipe is formed of resin and has a curved portion, the curved portion being configured to impart flection to the insulating pipe,
wherein
each of the first connecting member and the second connecting member includes:
a tubular portion extending in a stack direction in which the second stage is stacked on the first stage,
a first connecting portion that is provided at an upper end in the stack direction of the tubular portion, and
a second connecting portion that is provided at a lower end in the stack direction of the tubular portion, and
wherein
the first coupler couples the first end portion of the connecting pipe to the first connecting portion of the first connecting member, and
the second coupler couples the second end portion of the connecting pipe to the second connecting portion of the second connecting member.

2. The power conversion apparatus according to claim 1, wherein
the first coupler has
a first socket provided at the first connecting member, and
a first plug provided at the first end portion of the connecting pipe, the first plug being coupled to the first socket, and
the second coupler has
a second socket provided at the second connecting member and
a second plug provided at the second end portion of the connecting pipe, the second plug being coupled to the second socket.

3. The power conversion apparatus according to claim 2, wherein each of the first and second couplers is a one-touch coupler.

4. The power conversion apparatus according to claim 1, wherein
each of the first and second cooling pipes has
a linear portion and
a bending portion positioned between the linear portion and the opening end and bent relative to the linear portion, wherein
each of the first and second connecting members is displaceable in a direction intersecting the stack direction and the stack direction relative to the linear portion through the bending portion.

5. The power conversion apparatus according to claim 2, wherein
each of the first and second plugs has a curved surface shape protruding outward on an outer peripheral surface of a coupling portion to the insulating pipe.

6. The power conversion apparatus according to claim 2, wherein
each of the first and second cooling pipes has
a linear portion and
a bending portion positioned between the linear portion and the opening end and bent relative to the linear portion, wherein
each of the first and second connecting members is displaceable in a direction intersecting the stack direction and the stack direction relative to the linear portion through the bending portion.

7. The power conversion apparatus according to claim 3, wherein
each of the first and second cooling pipes has
a linear portion and
a bending portion positioned between the linear portion and the opening end and bent relative to the linear portion, wherein
each of the first and second connecting members is displaceable in a direction intersecting the stack direction and the stack direction relative to the linear portion through the bending portion.

8. The power conversion apparatus according to claim 3, wherein
each of the first and second plugs has a curved surface shape protruding outward on an outer peripheral surface of a coupling portion to the insulating pipe.

* * * * *